March 1, 1966 H. H. HILL 3,238,387
BISTABLE MULTIVIBRATORS
Filed Oct. 11, 1963
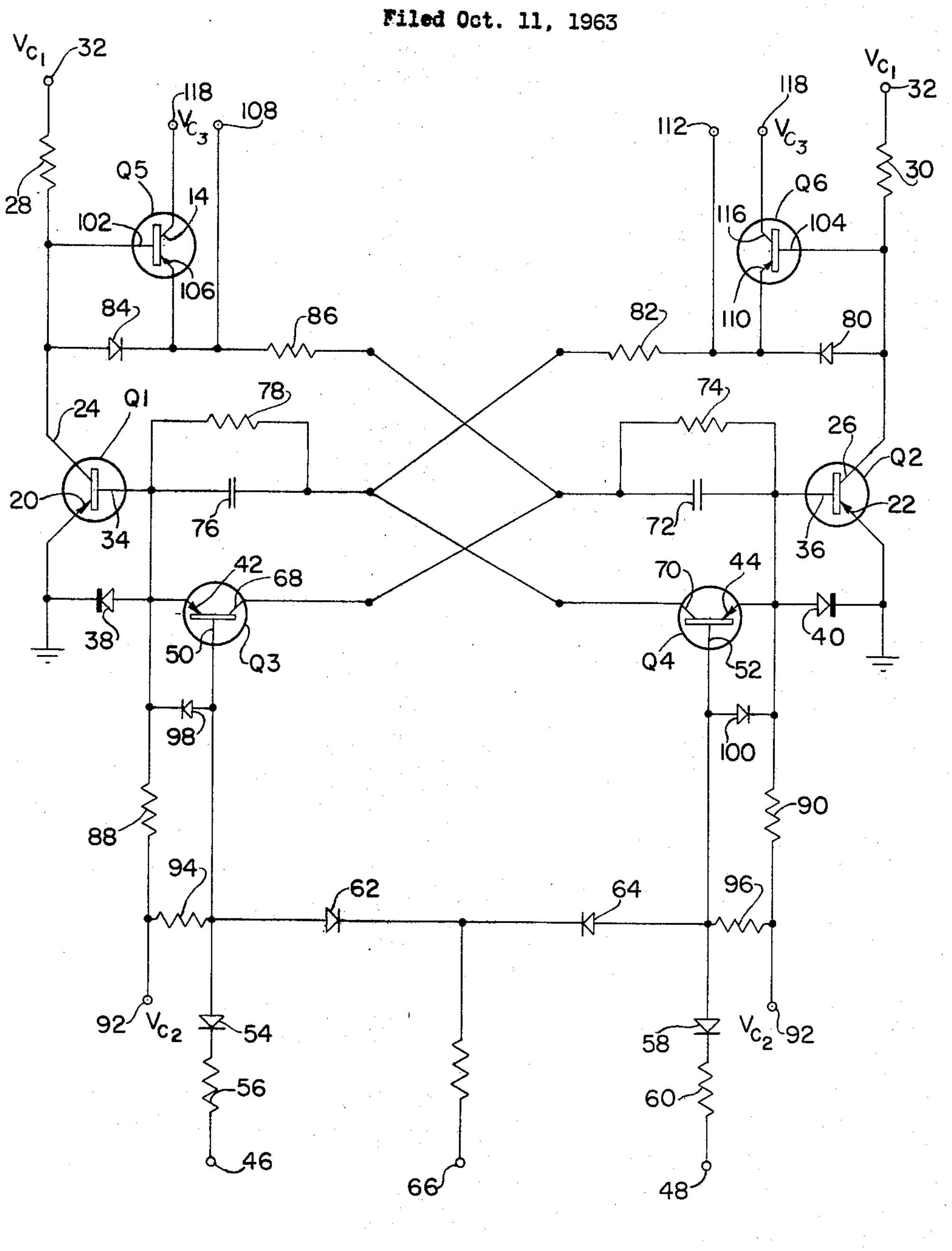
INVENTOR.
HOWARD H. HILL
BY
Rosen & Schiller
ATTORNEYS 3,238,387
BISTABLE MULTIVIBRATORS Howard H. Hill, Northborough, Mass., assignor to Computer Control Company, Incorporated, Framingham, Mass., a corporation of Delaware Filed Oct. 11, 1963, Ser. No. 315,448
5 Claims. (Cl. 307—88.5)

This invention relates to bistable multivibrators and particularly to novel means for triggering high speed bistable multivibrators.

A bistable multivibrator, more commonly known as a "flip-flop" or Eccles-Jordan type of circuit, is a regenerative switching circuit basically employing a pair of inverter amplifiers, such as transistors, which assume opposite stable states of conduction. These states can persist indefinitely and can be caused to shift abruptly to their opposite state.

Flip-flops find particular utility in digital circuits as counters, in digital computers as a two-stable-state storage device, and serve many other purposes. In computer circuitry, it is highly desirable that the output of a flip-flop be unambiguously triggered by its input, that the flip-flop operate at a very high speed, and that the power employed by the flip-flop be reduced to a minimum.

A flip-flop will remain in a condition where one inverter is conductive and the other is non-conductive until caused to make a transition by a triggering signal from an external source. The triggering signal is frequently a pulse of very short duration which can be followed very shortly by another such pulse. The response of the flip-flop to the first pulse must be completed before the second pulse appears if the flip-flop state is to reflect the triggering signals in an accurate and unambiguous manner.

Accordingly, objects of the present invention are to provide novel and improved circuit topology for triggering a bistable multivibrator which provides faster multivibrator response; to provide such a circuit which operates on both flip-flop inverters simultaneously; to provide such a circuit wherein the input power used is reduced substantially; to provide such a circuit whereby input trigger steering is enhanced; and to provide such a circuit in which input trigger amplifiers also serve to cross-couple the control terminals of the flip-flop inverters.

To achieve the foregoing objects, the invention is employed in conjunction with a bistable multivibrator or flip-flop including a pair of similar circuits, each having respective input and output terminals and an inverter-amplifier switch, such as a transistor, connecting the input with the output terminal. In one stable state of the flip-flop, one transistor is in conductive condition, the other transistor being non-conductive. The transistors are regeneratively cross-coupled in known manner so that a triggering signal, such as a pulse, applied to an appropriate input terminal is intended to alter the state of the flip-flop such that the one transistor becomes non-conductive and the other transistor becomes conductive. The invention employs a pair of trigger-input amplifiers, each of which is associated with both inverter transistors, so that each input amplifier can serve an amplifying conductive path between the control terminals, such as the bases of the inverter transistors, when actuated by an input trigger pulse. Thus, the circuit is capable of delivering optimum base current to both switching transistors at the same time and the regeneration loop is entered at two points instead of one as is typical with prior art devices.

Other objects of the invention will in part be obvious and will in part hereinafter appear. The invention accordingly comprises the apparatus possessing the construction, combination of elements and arrangement of parts which are exemplified in the following detailed disclosure, and the scope of the application of which will be indicated in the claims. For a fuller understanding of the nature and objects of the present invention, reference should be had to the following detailed description taken in connection with the accompanying drawing wherein there is shown a schematic circuit diagram of a detailed embodiment of the present invention. Referring now to the drawing, there is illustrated a bistable multivibrator or flip-flop which includes the usual pair of inverter transistors Q1 and Q2 shown connected in grounded-emitter configuration. Associated with transistors Q1 and Q2 are respective trigger-input amplifiers or transistors Q3 and Q4 which are connected in common-collector configuration. The flip-flop also preferably includes another pair of emitter-follower connected transistors Q5 and Q6 which are adapted to provide low impedance drive for circuitry connected to the flip-flop outputs. For convenience, all of the transistors are illustrated as PNP conductivity type transistors. As in known flip-flops, it is intended that an inverter transistor that is in a non-conductive state will be switched into conduction by a transition, such as the leading edge of a negative going current pulse, applied to the base of the inverter transistor by its associated trigger-input amplifier transistor. Each of inverter transistors Q1 and Q2 has its respective emitter 20 and 22 grounded, and its respective collector 24 and 26 coupled through corresponding load resistors 28 and 30 to a source of negative voltage $V_{c1}$ at terminals 32. Bases 34 and 36 respectively of inverter transistors Q1 and Q2 are clamped to ground by a corresponding unilateral or asymmertic current conductive device, such as diodes 38 and 40 which are preferably of the silicon variety. Bases 34 and 36 are respectively connected also directly to emitters 42 and 44 of trigger-input transistors Q3 and Q4.

The flip-flop includes a pair of input terminals 46 and 48 adapted to have negative-going trigger pulses applied thereto for turning "on" (i.e. placing in a conductive state) the inverter transistor associated with the respective trigger-input transistor. Bases 50 and 52 of trigger-input transistors Q3 and Q4 are respectively coupled to input terminals 46 and 48 through gating diode 54 and its associated series resistor 56, and gating diode 58 and its series resistor 60. Bases 50 and 52 are also coupled through diodes 62 and 64 to a single complement or binary input terminal 66. Collectors 68 and 70 of trigger-input transistors Q3 and Q4 respectively are cross-connected so that collector 68 is coupled through paralleled capacitor 72 and resistor 74 to base 36 of transistor Q2, collector 70 of transistor Q4 being connected through paralleled capacitor 76 and resistor 78 to base 34 of transistor Q1. Collector 26 of transistor Q2 is clamped through diode 80 and series resistor 82 to collector 70 of transistor Q4. Similarly, collector 24 of transistor Q1 is clamped through diode 84 and series resistor 86 to collector 68 of transistor Q3.

Each of bases 34 and 36 are respectively connected through resistors 88 and 90 to a source of positive voltage $V_{c2}$ at terminals 92 which thus supplies $I_{co}$ to the inverter transistors. Bases 50 and 52 of transistors Q3 and Q4 are also respectively connected through resistors 94 and 96 to terminals 92. Base 50 and emitter 42 of transistor Q3 are coupled to one another through an asymmetric current conductive device such as diode 98, a similar diode 100 providing coupling between base 52 and emitter 44 of transistor Q4. Output transistors Q5 and Q6 are connected so as to substantially reduce the effects of load capacity on the collectors of the inverter stages during turn-off transition and are on at all times except during the period when the associated inverter transistor is turning off. Thus, base 102 of transistor Q5 is connected directly to collector 24 of transistor Q1, and correspondingly base 104 of transistor Q6 is connected directly to collector 26 of transistor Q2. Base 102 is also coupled through diode 84 to both emitter 106 of transistor Q5 and to first output terminal 108 of the flip-flop. Similarly, base 104 is coupled through diode 80 to emitter 110 of transistor Q6 and to second output terminal 112 of the flip-flop. The diode coupling of the base and emitter electrodes of transistors Q3, Q4, Q5 and Q6 enables conduction of the particular transistor through maintenance of the proper potential gradient between emitter and base. Collectors 114 and 116 respectively of transistors Q5 and Q6 are connected to appropriate sources of negative bias $V_{c3}$ as at terminals 118.

For convenience in describing the operation of the embodiment of FIGURE 1, certain values or types for selected elements of the circuit can be assumed as follows:

| | |
|---|---|
| $V_{c1}$ | −12 v. |
| $V_{c2}$ | +12 v. |
| $V_{c3}$ | −4 v. |
| Cap. **72, 76** | 47 $\mu\mu$f. |
| Res. **74, 78** | 1.5 kΩ. |
| Res. **28, 30** | 300 Ω. |
| Q1, Q2 | 2N1204. |
| Q3. Q4 | 2N499. |
| Q5, Q6 | 2N501. |
| Diodes **38, 40** | Si diodes. |
| All other diodes | Ge diodes. |

The state of the flip-flop is reflected by the nature of the output voltages appearing at terminals 108 and 112 during operation, and can be altered by the application of a current pulse of appropriate polarity and magnitude at the proper input terminal of the flip-flop. In accordance with the well-known operating characteristics of flip-flops, either, but not both, of the input trigger transistors will have the correct operating voltages at its terminals for receiving and amplifying an input trigger pulse, depending upon the state of the flip-flop. For example, assume that the flip-flop state is steady and that transistor Q1 is conducting or "on." Then base 34 of transistor Q1 and emitter 42 of transistor Q3 are at about −0.4 v., collector 70 of transistor Q4 is at about −2.3 v., and output terminal 112 is approximately −4.0 v. Because at that time, transistor Q2 is non-conducting or "off," its base 36 and emitter 44 of transistor Q4 are about +0.8 v., collector 68 of transistor Q3 is at about +0.2 v. and output terminal 108 is near −0.4 v. Thus, a negative-going pulse (for example, between ground and −3 v. for 10 nanoseconds) when applied to any of input terminal 46, 68 or 66 can forward bias only the emitter-base junction of the trigger input amplifier which has the proper operating potentials, e.g. in this example, transistor Q4 whose emitter is at +0.8 v.

This drives transistor Q4 into a conductive state whereby, not only is the trigger signal as amplified by the $\beta$ of transistor Q4 coupled directly to base 36 of the nonconducting transistor Q2, but base 36 also becomes coupled to base 34 of transistor Q1 through the RC network of resistor 78 and capacitor 76 and the collector-emitter circuit of transistor Q4. Thus, a current will flow from emitter 44 to collector 70 which tends to remove charge from base 36 so as to forward bias inverter transistor Q2. Together with the amplified input signal applied to base 36 by transistor Q4, the emitter-collector thus current drives transistor Q2 into saturation, turning it "on."

The collector of transistor Q4 is coupled to base 34 through a reactive charge-storing component, i.e. capacitor 76, and thus the correct operating voltages can be maintained to insure conduction through transistor Q4. Because of this coupling, the current in the emitter-collector circuit of transistor Q4, as it tends to turn transistor Q2 "on," also inserts charge into base 34 of transistor Q1, reverse-biasing the latter and turning it "off."

As in conventional flip-flops, the transition of transistor Q2 into conduction permits current flow through its collector-emitter junction. Part of this current passes through diode 80 to charge a capacitive load at terminal 112 which then tends to rise toward ground. Because of the regenerative loop which couples base 34 to collector 26, as the potential at terminal 112 rises, base 34 of transistor Q1 is therefore driven toward reverse-bias. It will be apparent then that the controlling potential on base 34 is in part derived from the usual regenerative coupling and in part from the base-to-base coupling provided by the activated trigger-amplifier. Similarly, the controlling potential at base 36 is in part derived from the above-noted base-to-base coupling and in part from the amplified trigger signal.

Any tendency to overshoot on the part of the reverse-biasing potential at base 34 is overcome by the clipping action provided by diode 38. Additionally the voltage drop across the latter serves to provide the input steering differential. Hence, for this reason and to increase the input-output isolation, diodes 38 and 40 can each be replaced with doubled series diodes so that the voltage drop across them approximates 1.6 v., thus providing in the example shown collector and emitter voltages respectively of about −2.3 v. and +0.8 v. for conditioning the appropriate trigger input amplifier transistor.

The operation of transistors Q5 and Q6 in providing emitter-follower action which insures low impedance drive to the output terminals is conventional and need not be described herein. For the circuit described and with no special effort to provide optimum parameters for high frequency operation, a 30 ma. output was obtained with a 1 ma., 5 m$\mu$ sec. input for complementary input rates exceeding 20 mc. The rise and fall time of the outputs was less than 10 m$\mu$ sec. with a total circuit delay from 10% of input pulse to 90% of latest output, transition being 25 m$\mu$ sec. generally.

The present invention thus provides, with respect to prior art devices, faster circuit response, decreased input power requirement, enhanced input steering and increased efficiency. The rise and fall times of the flip-flop are optimum inasmuch as the ratio of collector and base currents (to which the transistor switching response is proportional) for the inverter transistors, vary in a precisely inverse manner in time. Optimum base current is delivered to both inverter transistors almost truly simultaneously. Regeneration time is significantly reduced in that both inverters are operated upon simultaneously by entrance into the regeneration loop at two points instead of one. Thus regeneration time can be less than half that exhibited by conventional flip-flops. The input power required in the use of the circuit of the present invention is typically one to two magnitudes less than that required by conventional triggering circuits. Ambiguity in binary operation is minimized with the present circuit; one and only one of the input-trigger amplifiers can be conditioned for a given state of the flip-flop because of the base-to-base inverter coupling provided by the emitter-collector junctions of the input trigger amplifiers. Also, due to the reduced duration and current required for input trigger signaling, the input power required is typically one or two magnitudes less than is required by conventional triggering schemes. Lastly, it will be seen that with the use of the present invention to provide access to the regeneration loop at two points instead of one, the flip-flop becomes more efficient in that a lesser proportion of the flip-flop output need be fed back to obtain high-speed regeneration. The high transient currents required are largely supplied by the input-trigger amplifiers instead.

The multivibrator circuit described herein is also particularly useful in so-called micro circuits inasmuch as the six transistors can be readily grown in situ to provide a high performance flip-flop at small extra cost.

It will be apparent to those skilled in the art that the principle of the present invention is fully applicable to bistable multivibrators in a general sense and is not limited to the specific embodiment described. For example, the flip-flop can be collector or hybrid triggered instead of base-triggered as shown. While the transistors employed are all shown as pnp type, with appropriate adjustments for polarity changes in biasing voltages and diodes, npn transistors may also be used. Since certain other changes may be made in the above apparatus without departing from the scope of the invention herein involved it is intended that all matter contained in the above description or shown in the accompanying drawing shall be interpreted in an illustrative and not in a limiting sense.

What is claimed is:

1. A bistable multivibrator comprising in combination, a pair of substantially similar inverter transistors connected in grounded emitter configuration, an RC network and an isolation resistor connected in series between the base of each inverter transistor and the collector of the other inverter transistor for providing a regeneative path, a resistive connection between the collector of each said inverter transistor and a first voltage terminal for supply voltage of a first polarity with respect to ground, an output terminal connected to one of said inverter transistor collectors, a pair of substantially similar trigger transistors each having its emitter connected to the base of a corresponding inverter transistor, its collector connected at the junction of the isolation resistor and the RC network leading from the collector of the corresponding inverter transistor to the base of the other inverter transistor, its emitter further resistively connected to a second voltage terminal for supply voltage of a second polarity with respect to ground, and its base connected to an input terminal whereby when an input pulse causes one of said trigger transistors to conduct, the voltage at the emitter of said one changes and is coupled to the base of the corresponding inverter transistor so as to place it into conduction while simultaneously the voltage at the collector of said one changes and is coupled through the RC network to the base of the other inverter transistor so as to take it out of conduction, the operation of each said trigger transistor thus operating on both inverter transistors simultaneously and independently of operation of said regenerative path to increase the switching speed of said multivibrator.

2. A bistable multivibrator according to claim 1 in which said output terminal is connected to said inverter transistor collector through an emitter-follower transistor.

3. A bistable multivibrator according to claim 2 in which all said transistors are of the same conductivity type.

4. A bistable multivibrator according to claim 1 including voltage biasing means responsive to the state of the multivibrator to disable one of said trigger transistors blocking it from operation so that only a predetermined one of said trigger transistors can respond to a given input signal.

5. A bistable multivibrator according to claim 4 in which the base of each trigger transistor is connected to the same input terminal.

References Cited by the Examiner

UNITED STATES PATENTS 3,047,737 7/1962 Kolodin ------------ 307—88.5

OTHER REFERENCES

Pulse and Digital Circuits, by Millman & Taub (1956), McGraw-Hill Book Co., page 147, Fig. 5.5.

ARTHUR GAUSS, *Primary Examiner.*

J. HEYMAN, *Assistant Examiner.*